United States Patent
Hirotsugu et al.

(10) Patent No.: US 7,046,044 B2
(45) Date of Patent: May 16, 2006

(54) DIFFERENTIAL PREAMPLIFIER HAVING BALANCED RESISTOR NETWORK

(75) Inventors: Yukihisa Hirotsugu, Tokyo (JP);
Naoyuki Hanajima, Tokyo (JP); Hisao Ogiwara, Ibaragi (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/773,044

(22) Filed: Feb. 5, 2004

(65) Prior Publication Data

US 2005/0174168 A1    Aug. 11, 2005

(51) Int. Cl.
    *H03F 3/45*      (2006.01)
(52) U.S. Cl. .......................... 327/52; 327/51; 327/65; 360/46; 360/67; 360/68; 330/9
(58) Field of Classification Search .................. 327/51, 327/52, 65, 60, 63, 124, 30; 360/46, 67, 360/68
    See application file for complete search history.

(56) References Cited

U.S. PATENT DOCUMENTS

| 3,651,749 | A  | * | 3/1972 | De Groot ................... 396/233 |
| 6,552,593 | B1 | * | 4/2003 | Blon et al. .................. 327/307 |
| 6,711,396 | B1 | * | 3/2004 | Bergsma et al. ............ 455/317 |
| 6,762,625 | B1 | * | 7/2004 | Devnath ..................... 326/115 |
| 6,847,501 | B1 | * | 1/2005 | Cheung et al. ............... 360/46 |

* cited by examiner

*Primary Examiner*—Tuan T. Lam
*Assistant Examiner*—Hiep Nguyen
(74) *Attorney, Agent, or Firm*—W. Daniel Swayze, Jr.; W. James Brady; Frederick J. Telecky, Jr.

(57) ABSTRACT

The present invention comprises a pair of circuits (171, 172) within the first stage (100) of an AC signal pre-amplifier. The present invention reduces the current mismatch at the base of the first stage transistors (141, 142, 143, 144) resulting in faster switching times by reducing input stage offset and, hence improving input dynamic range.

19 Claims, 2 Drawing Sheets

US 7,046,044 B2

DIFFERENTIAL PREAMPLIFIER HAVING BALANCED RESISTOR NETWORK

FIELD OF THE INVENTION

The present invention relates to pre-amplifier circuits which are coupled to magneto-resistive ("MR") read/write heads utilized in hard disk drives ("HDDs").

BACKGROUND OF THE INVENTION

The typical MR read/write head comprises a sensor or element that senses ambient magnetic fields at the head, causing a relative change in MR resistance. The change or variation produces a current variation that is received in the preamplifier. AC coupling, typically using capacitors, between the MR sensor and the amplifier stages prevents the amplifier input stages from being overloaded by DC voltages across the MR elements. A number of techniques have been developed to shorten DC settling transients and hence increase recovery times of the MR element. These techniques have been developed to increase the speed of the preamplifier. Conventional ac signal amplifiers use a transistor circuit coupled to the bases of the pre-amplifier transistor differential pairs to compensate and maintain the base currents at pre-determined levels. Disadvantageously, transistors are rarely perfectly matched, which gives rise to various offsets due to feedback current mismatches. A current mismatch results in a large input offset and bad switching recovery time due to the offset. Other arrangements that are designed to increase switching times and improve dynamic range use complex feedback loops. But feedback loops give rise to other problems such as increased recovery time and increased control circuit complexity. In contrast, the configuration of the present invention is not overly complex. Further, the performance of the preamplifier is improved as the present invention requires no trim or tuning for operation.

SUMMARY OF THE INVENTION

The present invention is designed for AC signal preamplifiers, for use in among other things, the first stage of a MR sensor coupled preamplifier. The present invention reduces the current mismatch at the base of the first stage transistors, resulting in faster switching times by reducing input stage offset and, hence improving input dynamic range.

DETAILED DESCRIPTION OF THE INVENTION

When used with ac signal amplifiers, the present invention reduces current mismatch and results in faster switching times by reducing input stage offset. The present invention also improves input dynamic range. In order to optimize the performance of the present invention, no trim or tuning is required.

Figure 1:
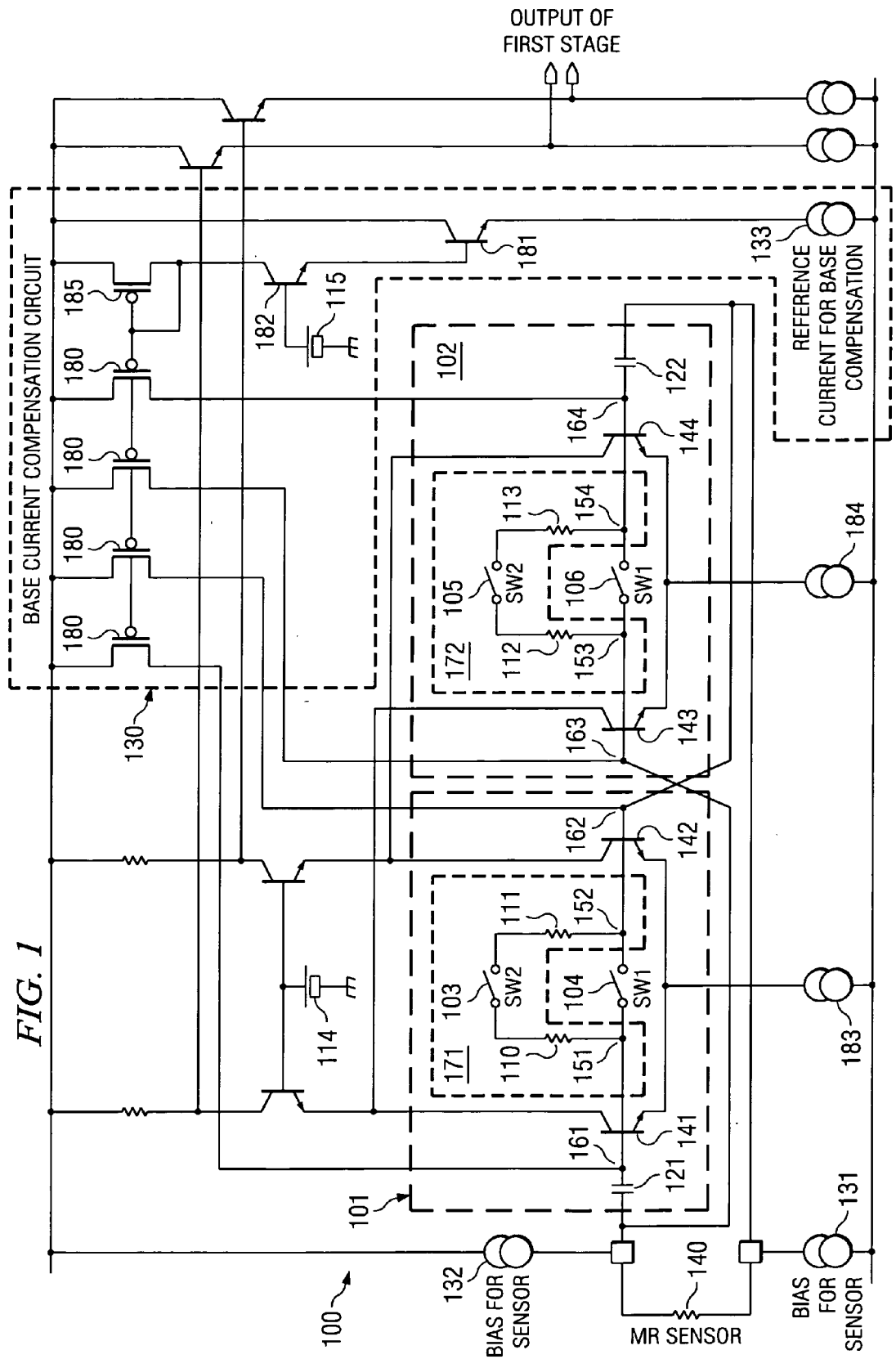
FIG. 1 is a circuit diagram of an amplifier of the present invention.

Referring to FIG. 1, MR sensor 140 is biased by a first current source 131 and a second current source 132 and is capacitively coupled to the preamplifier through first capacitor 121 and second capacitor 122. First capacitor 121 has a first terminal and second terminal, the second terminal being coupled at node 161 to the first circuit 101 of the preamplifier circuit. Second capacitor 122 has a first terminal and a second terminal, the second terminal being coupled at node 164 to the second circuit 102 of the preamplifier. The first terminal of the first capacitor 121 is cross-coupled to the second circuit 102 of the preamplifier circuit at node 163 and the first terminal of the second capacitor 122 is cross-coupled to the first circuit 101 of the preamplifier circuit at node 162. Base current compensation circuit 130 is coupled to the bases of a first amplifying transistor 141, a second amplifying transistor 142, a third amplifying transistor 143 and a fourth amplifying transistor 144. The base compensation circuit is comprised of a plurality of MOS transistors 180 driven by a reference current source 133. In operation the current value of current source 133 is basically a ratio of transistor 183 to transistor 184 and by the ratio of transistor 181 to transistor 141, transistor 142, transistor 143 and transistor 144. Transistor 182 is cascoded to the base of 181 for sensing the correct value of base current. If the beta of transistor 141, transistor 142, transistor 143, transistor 144 and transistor 181 is same, MOS transistors 180 will supply the correct value of base current.

The first capacitor 121 and second capacitor 122 prevent the DC component of the signal from entering the preamplifier. In normal operation, the impedance of capacitors 121 and 122 is very small in the signal band frequency. In such case, the circuit behaves like a single differential amplifier. But because the MR sensor requires bias, meaning the MR sensor has a voltage between its terminals, capacitors 121 and 122 need to charge until the differential pair base voltage is almost the same, Otherwise the circuit will not behave as a differential amplifier. Although this action is desired, it disadvantageously decreases the recovery time and hence speed of the entire circuit. What is desired is a configuration that retains the advantages of an AC coupled preamplifier circuit, but also is optimized for high speed operation.

The present invention comprises the first circuit 101 feeding an output of the first stage of the preamplifier and a second circuit 102 coupled to the first circuit 101 and also feeding the output of the first stage of the preamplifier. The first circuit 101 is coupled to the second circuit 102 through the coupling of the collector of the third amplifying transistor 143 to the collector of the first amplifying transistor 141 and the coupling of the collector of fourth amplifying transistor 144 to the collector of the second amplifying transistor 142. DC voltage sources 114 and 115 provide a cascade connect.

A current loop 171 within the first circuit 101 further comprises a first resistor 110 with a first terminal and second terminal, a first transistor switch 103 with an input and output and control lead, and a second resistor 111 with a first terminal and second terminal, the first resistor 110 and second resistor 111 comprising a pair of balanced resistors. The second terminal of the first resistor 110 is coupled to the input of the first transistor switch 103, the second terminal of the second resistor 111 is coupled to the output of the transistor switch 103, the first terminal of the first resistor 110 and the first terminal of the second resistor 111 are coupled to the bases of a first differential pair of transistors 141 and 142, respectively, with a second transistor switch 104 being coupled across the bases of the first differential pair of transistors 141 and 142 at nodes 151 and 152.

In addition, the present invention comprises a second current loop 172 within the second circuit 102. The second current loop comprising a third resistor 112 with a first terminal and second terminal, a third transistor switch 105 with an input and output, and a fourth resistor 113 with a first terminal and second terminal, the third and fourth resistors also comprising a pair of balanced resistors. These switches are on during normal read mode, when differential pairs 101 and 102 are active. The second terminal of the third resistor 112 is coupled to the input of the third transistor switch 105, the second terminal of the fourth resistor 113 is coupled to the output of the third transistor switch 105, the first terminal of the third resistor 112 and the first terminal of the fourth resistor 113 are coupled across the bases of a differential pair of transistors 143 and 144 with a fourth transistor switch 106 being coupled across nodes 153 and 154.

Figure 2:
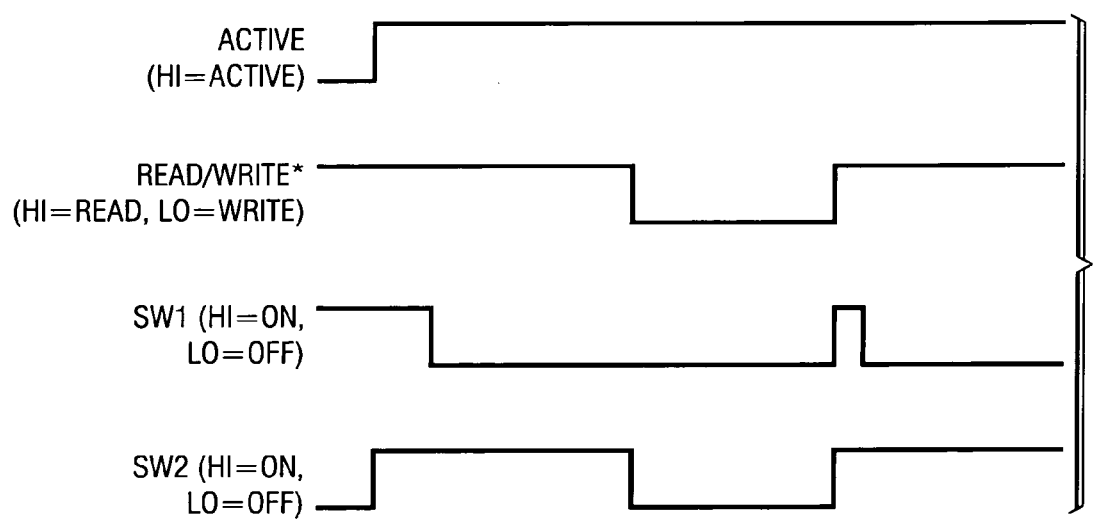
FIG. 2 is a plot of the control timing of the present invention.

Referring to the time domain waveform plot of FIG. 2, upon a mode change, transistor switches 104 and 106 turn on to charge up input capacitors 121 and 122 respectively. Without the current loops 171 and 172, and due to process or other variations, the time-based current provided by base current compensation circuit 130 to the amplifying transistors 141, 142, 143 and 144 are equal. As a result, an offset develops due to the differential in current between each side of the amplifying circuits coupled to the MR sensor. The input offset results in slow recovery times and poor input dynamic range.

FIG. 2, illustrates the control timing of switches 104 and 106. As seen in the plot of the control timing of FIG. 2, switches 104 and 106 are on during a very short period of time at switching due to the fast charge up of capacitors 121 and 122. The loop circuits 171 and 172 of the present invention operate to reduce the current mismatches between the two circuits 101 and 102. As a result the preamplifier has better recovery time and better input offset. Improving the input offset results in better input dynamic range.

The innovative teachings of the present invention are described with particular reference to its use in MR coupled preamplifier circuits. However, it should be understood and appreciated by those skilled in the art that these embodiments provide only one example of the many advantageous uses and innovative teachings herein. Various alterations, modifications and substitutions can be made to the disclosed invention without departing in any way from the spirit and scope of the invention.

What is claimed is:

1. The first stage of a preamplifier circuit, comprising:
    a first differential pair of amplifying transistors and a second differential pair of amplifying transistors;
    the bases of the first differential pair of amplifying transistors being capacitively coupled to the first side of an input through a first capacitor;
    the bases of the second differential pair of amplifying transistors being capacitively coupled to the second side of an input through a second capacitor;
    a first current loop and a second current loop;
    the first current loop comprised of a first resistor, a first transistor switch and a second resistor;
    the first resistor and second resistor having the same value;
    the second current loop comprised of a third resistor, a second transistor switch and a fourth resistor;
    the third resistor and fourth resistor having the same value;
    the first current loop being coupled to the bases of said first differential pair of amplifying transistors;
    the second current loop being coupled to the bases of said second differential pair of amplifying transistors;
    a third transistor switch being coupled across the bases of the first differential pair of amplifying transistors;
    a fourth transistor switch being coupled across the bases of the second differential pair of amplifying transistors; and
    the first current loop and second current loop operable to equalize the charges upon the first transistor and second transistor.

2. The first stage of a preamplifier circuit of claim 1, further comprising:
    a base current compensation circuit responsively coupled to the bases of the first differential pair of amplifying transistors and the bases of the second differential pair of amplifying transistors.

3. The first stage of a preamplifier circuit of claim 1, further comprising:
    an MR sensor;
    the first side of the MR sensor being coupled to the first terminal of the first capacitor; and
    the second side of the MR sensor being coupled to the first terminal of the second capacitor.

4. The first stage of a preamplifier circuit of claim 3, further comprising use in a hard disk drive read/write amplifier circuit.

5. The first stage of a preamplifier circuit of claim 1, wherein the first, second, third and fourth transistor switches are controlled by internal control circuits.

6. The first stage of a preamplifier circuit of claim 1, wherein the first, second, third and fourth transistor switches further comprise MOS switches.

7. The first stage of a preamplifier circuit of claim 6, wherein the first, second, third and fourth transistor switches further comprise either n-type transistors, p-type transistors or both.

8. An input preamplifier circuit stage, comprising:
    a first circuit comprised of at least a first pair of differential transistors having an input and providing an output from a first stage of the preamplifier;
    the first pair of differential transistors comprising a first amplifying transistor and a second amplifying transistor;
    a second circuit comprised of at least a second pair of differential transistors having an input, being coupled to the first circuit, and providing an output from the first stage of the preamplifier;
    the second pair of differential transistors comprising a third amplifying transistor and a fourth amplifying transistor;
    the first circuit being coupled to the second circuit through the coupling of the collector of third amplifying transistor to the collector of the first amplifying transistor and the coupling of the collector of fourth amplifying transistor to the collector of the second amplifying transistor;
    a first current loop within the first circuit;
    a second current loop within the second circuit;
    the first current loop comprising a first resistor with a first terminal and second terminal, a first transistor switch with an input and output and a second resistor with a first terminal and second terminal;
    the first resistor and second resistor comprising a pair of balanced resistors;
    the second terminal of the first resistor being coupled to the input of the first transistor switch;
    the second terminal of the second resistor being coupled to the output of the first transistor switch;

the first terminal of the first resistor and the first terminal of the second resistor being coupled across the bases of the first pair of differential transistors;

a second transistor switch being coupled across the bases of the first amplifying transistor and the second amplifying transistor;

the second current loop within the second circuit comprising a third resistor with a first terminal and second terminal;

a third transistor switch with an input and output;

a fourth resistor with a first terminal and second terminal, the third and fourth resistors also comprising a pair of balanced resistors;

the second terminal of the third resistor being coupled to the input of the third transistor switch;

the second terminal of the fourth resistor being coupled to the output of the third transistor switch;

the first terminal of the third resistor and the first terminal of the fourth resistor being coupled across the bases of the second differential pair of transistors; and a fourth transistor switch being coupled across the bases of the third amplifying transistor and the fourth amplifying transistor.

9. The input preamplifier circuit stage of claim 8, further comprising a base current compensation circuit responsively coupled to the bases of the first differential pair of amplifying transistors and the bases of the second differential pair of amplifying transistors; and the base current compensation circuit being operable to equalize the current to the bases of the first differential pair of amplifying transistors and the bases of the second differential pair of amplifying transistors.

10. The input preamplifier circuit stage of claim 9, further comprising:

an MR sensor; and a means of capacitively coupling the MR sensor to the input of the first circuit and the input of the second circuit.

11. The input preamplifier circuit stage of claim 10, further comprising:

the means of capacitively coupling the MR sensor to the input of the first circuit being a first capacitor;

the means of capacitively coupling the MR sensor to the input of the second circuit being a second capacitor;

the first side of the MR sensor being coupled to the first terminal of the first capacitor; and the second side of the MR sensor being coupled to the first terminal of the second capacitor.

12. The input preamplifier circuit stage of claim 11, wherein the first current loop and second current loop operate to reduce the offset in differential current between each side of the amplifying circuits coupled to the MR sensor.

13. The input preamplifier circuit stage of claim 12, further comprising use in a hard disk drive read/write amplifier circuit.

14. The input preamplifier circuit stage of claim 8, wherein the first, second, third and fourth transistor switches are controlled by internal control circuits.

15. The input preamplifier circuit stage of claim 14, wherein the first, second, third and fourth transistor switches further comprise MOS transistors, bipolar transistors or either type of transistors.

16. The input preamplifier circuit stage of claim 15, wherein the first, second, third and fourth transistor switches further comprise either n-type transistors, p-type transistors or both.

17. A method of reducing the offset current from a base current compensation circuit, comprising:

placing a current loop comprised of a balanced pair of resistors opposite each other and a pair of transistor switches opposite each other across the bases of a differential pair of transistors; and capacitively coupling said current loop to the input of a circuit so that the current loop charges input capacitors so as to decrease the recovery time of the circuit.

18. The method for reducing the offset current from a base current compensation circuit of claim 17, wherein said method is used in a MR preamplifier circuit.

19. The circuit for reducing the offset current from a base current compensation circuit of claim 18, wherein said method is used in a hard disk drive circuit.

* * * * *